(12) United States Patent
Benesty et al.

(10) Patent No.: US 6,611,594 B1
(45) Date of Patent: Aug. 26, 2003

(54) ROBUST SIGNED REGRESSOR PNLMS METHOD AND APPARATUS FOR NETWORK ECHO CANCELLATION

(75) Inventors: Jacob Benesty, Summit, NJ (US); Thomas Fritz Gaensler, Chatham, NJ (US)

(73) Assignee: Agere Systems, Inc., Berkeley Heights, NJ (US)

( * ) Notice: Subject to any disclaimer, the term of this patent is extended or adjusted under 35 U.S.C. 154(b) by 19 days.

(21) Appl. No.: 09/695,787

(22) Filed: Oct. 25, 2000

(51) Int. Cl.[7] ............................................... H04M 1/00
(52) U.S. Cl. ............................. 379/406.09; 379/406.01
(58) Field of Search ..................... 379/406.01, 406.09; 370/286; 708/322

(56) References Cited

U.S. PATENT DOCUMENTS 5,951,626 A * 9/1999 Duttweiler .................. 708/322

OTHER PUBLICATIONS

Takahashi et al., A New Normalized Signed Regressor LMS Algorithm, Singapore ICCS/ISITA '92, pp.: 1181–1185 vol. 3.*

* cited by examiner

*Primary Examiner*—Forester W. Isen
*Assistant Examiner*—Jefferey Harold
(74) *Attorney, Agent, or Firm*—Synnestvedt & Lechner LLP

(57) ABSTRACT

The invention is a method and apparatus for performing echo cancellation utilizing a Proportionate Normalized Least Mean Squares (PNLMS) algorithm having a high convergence rate and low complexity. The invention utilizes a proportional step-size adaptive algorithm which utilizes the signs of the regressor rather than the regressor value itself in the gradient calculation.

32 Claims, 5 Drawing Sheets

SECONDS

SECONDS

ROBUST SIGNED REGRESSOR PNLMS METHOD AND APPARATUS FOR NETWORK ECHO CANCELLATION

FIELD OF THE INVENTION

The invention pertains to network echo cancellation. The invention is particularly suitable for use for hybrid echo cancellation at a two wire to four wire interface in a communications network such as a telephone network.

BACKGROUND OF THE INVENTION

In communications networks, it is possible for an echo of an upstream signal to be coupled onto a downstream signal (directions arbitrary), which echo either corrupts data or decreases the quality of data (e.g., increased noise). For instance, in telephone communications networks, the individual customers usually couple into the main telephone network through a two wire, analog connection in which transmissions in both directions are carried on the same pair of wires (tip and ring). However, the central portion of the network typically is a four wire, digital system in which communications in the upstream and downstream directions are carried on separate wire pairs (i.e., two wires in the receive direction and two wires in the transmit direction).

The interface between the two wire and the four wire portions of the network are a source of echo. The echos typically result because the impedance of the 2-wire facility is imperfectly balanced in the 4-to-2 wire junction causing the incoming signal to be partially reflected over an outgoing path to the source of incoming signals.

The circuitry interfacing the two wire and four wire portions of the network is commonly termed a line interface card. The standard components of a line interface card are well known to persons of skill in the related arts. One of those components is a hybrid cancellation circuit, the function of which is to cancel echo signals in order to improve the quality of service. In short, a hybrid cancellation circuit generates an attenuated version of the original receive signal (that is the source of the echo) and subtracts it from the signal lines that carry the transmit signal onto which the echo has been imposed. These hybrid cancellation circuits utilize an adaptive filter to operate on a supplied signal in a prescribed manner such that a desired output signal is generated.

Typically, adaptive filters generate a transfer function according to an algorithm that includes updating the transfer function characteristic in response to an error signal. In this manner, the filter characteristic is optimized to produce a desired result.

When used in an echo cancellation circuit, an adaptive filter is used to generate an echo path estimate that is updated in response to an error signal. Adaptive echo cancelers have been employed to mitigate the echoes by adjusting the transfer function (impulse response) characteristic of an adaptive filter to generate an estimate of the reflected signal or echo and, then, subtracting it from the outgoing signal. The filter impulse response characteristic and, hence, the echo estimate is updated in response to the outgoing signal for more closely approximating the echo to be cancelled.

Various designs and algorithms for adaptive filters for echo cancellation are well known. Although prior art arrangements of adaptive filters perform satisfactorily in some applications, often it is impossible to simultaneously achieve both sufficiently fast response to changing echo paths and sufficiently high steady-state estimation quality. Consequently a continuing need is to achieve more rapid response to changing conditions while at the same time maintaining adequate steady-state estimation quality.

Figure 1:
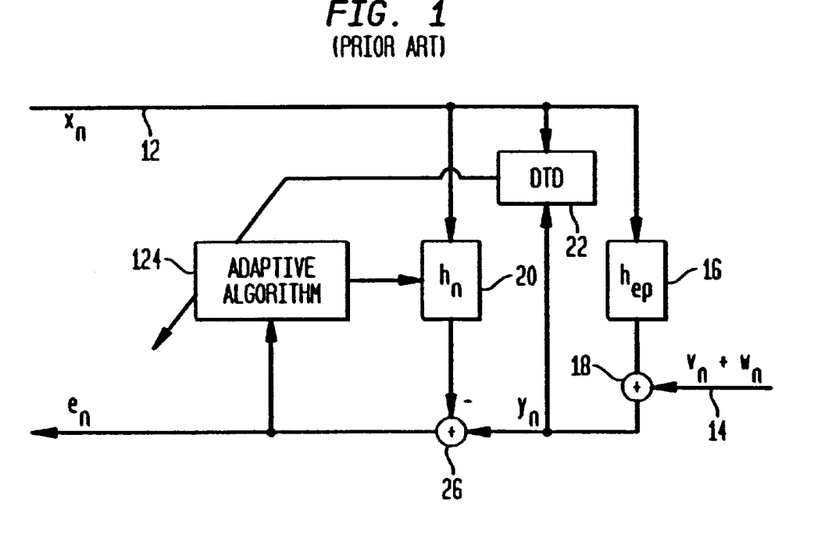
FIG. 1 is a functional block diagram illustrating the operation of a typical echo cancellation circuit of the prior art.

FIG. 1 is a block diagram illustrating an exemplary network echo cancellation circuit 10. Input line 12 carries the far-end signal $x_n$ (i.e., the receive direction signal relative to the transceiver having the echo cancellation circuit). Input line 14 carries the near-end signal $w_n$ as well as background noise $v_n$. The far-end signal $x_n$ is the source of potential echo.

Block 16 represents the true echo path $h_{ep}$ which is coupled into the near-end signal on line 14 as represented by summation node 18. In accordance with an echo cancellation scheme, the far-end signal $x_n$ is also input into an echo cancellation circuit 20 which generates an estimated echo path $h_n$. The estimated signal path $h_n$ is generated using a digital adaptive filter algorithm as illustrated by block 124. The estimated echo signal is then subtracted at subtraction circuit 26 from the signal path $y_n$, which includes the true echo $h_{ep}$, the near-end signal $w_n$, and the background noise $v_n$. FIG. 1 also illustrates an additional feature known as a double-talk detector 22 which is often incorporated into echo cancellation schemes. A double-talk detector receives at its inputs the incoming far-end signal, $x_n$, and the outgoing near-end signal $w_n$, including background noise, $v_n$, and echo and detects when significant signals exists simultaneously in both directions. When such a condition is detected, the double-talk detector 22 controls the adaptive filter so as to prevent it from adapting to the double-talk situation, which would otherwise temporarily decrease the quality of echo cancellation once the double-talk condition ceases.

Other circumstances in which network echo cancellation may be necessary or at least desirable are numerous and would be well known to persons of skill in the related arts.

Even further, acoustic echo cancellation systems are known in the prior art such as in connection with audio teleconferencing equipment. Particularly, when using a speaker phone, there is a path between the telephone speaker and the telephone microphone through which an echo can be introduced. Particularly, the microphone in a room picks up the sound created in the room. Part of the sound created in the room includes the sound coming from the opposite end of the telephone call that emanates from the telephone speaker. This creates a feedback loop that can result in distortion and, in the worst cases, howling instability.

Many digital adaptive algorithms for echo cancellation are known in the prior art, including Least Mean Squares (LMS) algorithms, Normalized Least Mean Squares (NLMS) algorithms, and Proportionate Normalized Least Mean Squares (PNLMS) among others. Generally, the more effective the particular algorithm at cancelling echo signals, the greater the processing power required to implement the algorithm.

Accordingly, it is an object of the present invention to provide an adaptive algorithm particularly adapted for echo cancellation that is both effective in terms of echo cancellation and efficient in terms of minimizing the complexity of the calculations.

SUMMARY OF THE INVENTION

The invention is a method and apparatus for performing echo cancellation utilizing an efficient and effective adaptive algorithm. The invention is particularly useful in connection with network echo cancellation but is more broadly applicable to any situation where an adaptive estimate of a signal must be generated in real-time. For instance, the invention also may be applied to acoustic echo cancellation such as in teleconferencing systems.

The invention includes a signed regressor proportionate normalized least mean squares algorithm for generating an echo cancellation signal to be subtracted from the echo containing signal. The algorithm is a step-size adaptive algorithm with lower complexity and smaller numerical dynamic range compared to prior art PNLMS algorithms. The present invention achieves such goals by using the signs of the regressor rather than the regressor value itself in the gradient calculation. The resultant convergence rate of the algorithm is about the same as for prior art PNLMS algorithms, but with much lower processing power requirements.

Also disclosed is a double-talk robust version of the algorithm with superior performance particularly when exposed to high level near-end signals.

DETAILED DESCRIPTION OF THE INVENTION

1. Introduction

Lately, faster converging algorithms known as proportionate step-size algorithms, have been proposed. These algorithms utilize the sparseness of a network echo path in order to achieve higher convergence rate. A robust PNLMS++ (Proportionate Normalized Least Mean Squares) algorithm, which is an extension of the PNLMS algorithm, has been implemented in the ECPR-5 echo canceler chip available from Lucent Technologies, Inc. of Murray Hill, N.J., USA.

A drawback of PNLMS is that it requires about twice the number of multiplications (depending on type of normalization) compared to the traditional NLMS (Normalized Least Mean Squares) echo canceler algorithm. In this specification, we propose a signed regressor PNLMS (SR-PNLMS) algorithm with reduced complexity and smaller numerical computational range.

This is desirable when the algorithm is implemented in fixed-point arithmetic. It turns out that the convergence performance of this new algorithm is basically the same as that of PNLMS with only a slight increase of minimum achievable mean square error. The performance loss is due to higher gradient noise in the adaption calculations.

The following detailed description of the invention is organized as follows. In section 2, we introduce the notation and review the traditional NLMS and the faster converging PNLMS algorithms. Thereafter, section 3 presents the signed regressor LMS, which is further developed into a signed regressor NLMS algorithm. In this section, we also propose a proper normalization of the regularization parameter in order to provide the same performance for non-stationary input signals as is achieved with regularized NLMS. Section 4 presents the new signed regressor PNLMS algorithm. Complexity and numerical range comparisons are made in section 5. Section 6 shows the performance of the new signed regressor PNLMS algorthim compared to prior art NLMS and PNLMS techniques, and a conclusion is given in section 7.

2. The NLMS and PNLMS Algorithms

In derivations and descriptions the following notations are used. See also FIG. 1.

$x_n$=Far-end signal, (1)

$v_n$=Background noise, (2)

$w_n$=Near-end signal, (3)

$y_n$=Echo and background noise possibly including near-end signal, (4)

$x_n=[x_n, \ldots, x_{n-L+1}]^T$, Excitation vector, (5)

$h_{ep}=[h_0, \ldots, h_{L-1}]^T$, True echo path, (6)

$h_n=[h_{0,n}, \ldots, h_{L-1,n}]^T$, Estimated echo path, (7)

$e_n=y_n-h_n^T x_n$, Residual error. (8)

where L is the length of the adaptive filter.

Referring to FIG. 1, the purpose of the adaptive filter is to estimate the echo path so that it can subtract a replica of the returned echo, $y_n$. Traditionally, the NLMS algorithm has been the work-horse in echo canceler implementation. It, therefore, serves as a reference algorithm. The coefficient update equation is given by, $$h_n = h_{n-1} + \frac{\mu}{x_n^T x_n + \delta} x_n e_n \quad (9)$$

Network echo paths are usually sparse, which means that a large number of coefficients in the impulse response are zero, hence, it is more important to identify the non-zero (active) coefficients. An algorithm that takes this property into account is the PNLMS algorithm. The PNLMS algorithm was proposed in D. L. Duttweiler, "Proportionate normalized least mean square adaptation in echo cancelers," I.E.E.E. Transactions on Speech and Audio Processing, vol. 8, September 2000, p. 508–518. In this algorithm, an adaptive individual step-size is assigned to each filter coefficient. The step-sizes are calculated from the last estimate of the filter coefficients so that larger coefficients receive a larger weight, thus increasing the convergence rate of that coefficient. This has the effect that active coefficients are adjusted faster than non-active coefficients (i.e., small or zero coefficients). The PNLMS algorithm is described by the following equations:

$$h_n = h_{n-1} + \frac{\mu}{x_n^T G_n x_n + \delta} G_n x_n e_n \quad (10)$$

$$G_n = diag\{g_{0,n}, \ldots, g_{L-1,n}\} \quad (11)$$

$G_n$ is a diagonal matrix which adjusts the step-sizes of the individual taps of the filter, $\mu$ is the overall step-size parameter, and $\delta$ is a regularization parameter which prevents division by zero and stabilizes the solution when speech is the input signal. The diagonal elements of $G_n$ are calculated as follows;

$$g_{l,n} = L\gamma_{l,n} / \sum_{i=0}^{L-1} \gamma_{i,n}, 0 \le l \le L-1, \quad (12)$$

where $$\gamma_{l,n} = \max\{\rho \max\{\delta_p, |h_{0,n}|, \ldots, |h_{L-1,n}|\}, 0 \le l \le L-1 \quad (13)$$

Parameters $\delta_p$ and $\rho$ are positive numbers with typical values $\delta_p=0.01$, $\rho=5/L$. $\rho$ prevents coefficients from stalling when they are much smaller than the largest coefficient and $\delta_p$ regularizes the updating when all coefficients are zero at initialization.

A variant of this algorithm is the PNLMS++, S. L. Gay, "An efficient fast converging adaptive filter for network echo cancellation", Proceedings of ASSIMOLAR, November 1998. In this algorithm, for odd-numbered time steps, the matrix $G_n$ is calculated as above, while for even-numbered steps, it is chosen to be the identity matrix, $$G_n = I, \quad (14)$$

which results in an NLMS iteration (Eq. 9). The alteration between NLMS and PNIMS iterations has several advantages compared to just using the PNLMS technique. For example, it makes the ++ algorithm much less sensitive to the assumption of a sparse impulse response without significant loss in performance.

3. The Signed Regressor NLMS Algorithm

A variant of the LMS algorithm called the signed regressor LMS algorithm, can be found in, e.g, P. M. Clarkson, *Optimal and Adaptive Signal Processing, CRC*, 1993. In this algorithm, the regressor, i.e., the excitation vector $x_n$ is replaced by a vector containing only the signs of the input samples, $x_{n-i}$, l=0 . . . L–1. The rationale for this algorithm is that using only the signs of the excitation vector leads to a less complex (in terms of multiplications) algorithm. One drawback is slower convergence due to the distortion that the sign operator causes to the gradient.

Let the function sign {a} operate on each element in the arbitrary vector a, i.e., it returns a vector containing ±1 depending on the sign of the element. The signed LMS coefficient update is given by, $$h_n 32\ h_{n-1} + \mu \text{sign}\{x_n\} e_n \quad (15)$$

For a non-stationary signal such as speech, the signed LMS is not properly normalized, i.e., it has different convergence rate depending on the power of the excitation signal. To alleviate this problem, we propose a normalized version of (Eq. 15) where we normalize by the sum of the magnitude of the input samples giving, $$h_n = h_{n-1} + \frac{\mu}{x_n^T \text{sign}\{x_n\} + \delta/(x_n^T \text{sign}\{x_n\} + \delta_r)} \text{sign}\{x_n\} e_n \quad (16)$$

The normalization is sound since the gradient in (Eq. 15) $(\text{sign}\{x_n\}e_n = \text{sign}\{x_n\}[x_n^T(h_{ep}-h_n)+v_n])$ is proportional to the magnitude of $\chi_n$. Furthermore, the regularization parameter $\delta$ should also be scaled by $$\sum_{i=0}^{L-1} |x_{n-i}| + \delta_r = x_n^T \text{sign}\{x_n\} + \delta_r,$$

where $\delta_r$ inhibits division by zero. With this scaling of $\delta$, the effect of regularizing (Eq. 16) is the same as regularizing with $\delta$ in (Eq. 9).

4. The Signed Regressor PNLMS Algorithm

We propose to combine the signed regressor and the proportionate step-size matrix together with proper normalization and regularization. Our motivation is to remedy the reduced convergence rate that results from using the signed regressor NLMS compared to NLMS and the reduction of the complexity of PNIMS. A basic signed regressor PNLMS (SR-PNLMS) algorithm is, $$h_n = h_{n-1} + \frac{\mu}{x_n^T G_n \text{sign}\{x_n\} + \delta/(x_n^T \text{sign}\{x_n\} + \delta_r)} G_n \text{sign}\{x_n\} e_n \quad (17)$$

The algorithm has still a rather high numerical complexity because of the term, $x_n^T G_n \text{sign}\{x_n\}$, which consumes L multiplications. A more efficient normalization that works well for sparse echo paths is $$h_n = h_{n-1} + \frac{\mu}{2\rho g_{max,n} x_n^T \text{sign}\{x_n\} + \delta/(x_n^T \text{sign}\{x_n\} + \delta_r)} G_n \text{sign}\{x_n\} e_n \quad (18)$$

However, for disperse echo paths, this algorithm may become unstable.

A "++" version can also be given in the same manner as for PNLMS++ for these algorithms by, e.g., alternating between (Eq. 17) and (Eq. 16).

4.1 A Robust SR-PNLMS Algorithm

For robustness against double-talk we can introduce the scaled nonlinearity and apply it to the residual error signal as was proposed in T. Gaensler, S. L. Gay, M. M. Sondhi, and J. Benesty, "Double-talk robust fast converging algorithms for network echo cancellation," I.E.E.E. Transactions on Speech and Audio Processing, vol. 8, no. 6, November, 2000.

$$h_n = h_{n-1} + \quad (19)$$

$$\frac{\mu}{x_n^T \text{sign}\{x_n\} + \delta/(x_n^T \text{sign}\{x_n\} + \delta_r)} G_n \text{sign}\{x_n\} \psi\left(\frac{|e_n|}{s_{n-1}}\right) \text{sign}\{e\} s_{n-1},$$

where $\psi(.)$ is a nonlinear function and $s_n$ is an adaptive scale factor. A proper and simple choice of this function is a limiter, P. J. Huber, *Robust Statistics*, pp. 68–71, 135–138, New York: Wiley, 1981.

$$\psi\left(\frac{|e_n|}{s}\right) = \min\left\{k_0, \frac{|e_n|}{s}\right\}, \quad (20)$$

where the parameter $k_0$ controls the level of robustness. A smaller value of $k_0$ results in more limited error samples and thus greater robustness. The estimate of the scale factor, $s_n$, should reflect the background noise level at the near-end, be robust to short burst disturbances (double-talk), and track long term changes of the residual error (echo path changes). To fulfill these requirements, we have chosen the scale factor estimate as, $$s_n = \lambda s_{n-1} + \frac{1-\lambda}{\beta} s_{n-1} \psi\left(\frac{|e_n|}{s_{n-1}}\right), \quad (21)$$

where $\beta$ is a normalization constant. The choice of this method of estimating s, which is very simple to implement, is justified in Id.

5. Complexity and Numerical Range Comparisons

The proposed signed algorithms have advances over the PNLMS and NLMS algorithms from a complexity and numerical range point of view.

Looking at the NLMS, (Eq. 9), PNLMS, (Eq. 10), and SR-PNLMS (Eq. 18), we find that they need L multiplications for calculating the residual error $e_n$. The normalization factor of NIMS can be recursively calculated using 2 multiplications and the gradient needs another L multiplications. The total for the basic NLMS is thus 2L+2 multiplications. Because of the individual step-size matrix $G_n$, PNLMS requires another 2L multiplications for the gradient calculation and normalization compared to NLMS. Signed regressor PNIMS however, needs only L extra multiplications for the gradient calculation. Table 1 below summarizes the complexity requirements for the different algorithms.

TABLE 1

Approximative computational requirements.

| Algorithm | Multiplications | Divisions |
|---|---|---|
| NLMS | 2L + 3 | 1 |
| PNLMS | 4L + 4 | 1 |
| SR-PNLMS | 3L + 3 | 2 |
| SR-PNLMS (fast) | 2L + 6 | 2 |

Another important factor when implementing an adaptive algorithm in fixed-point arithmetic is the numerical range of needed calculations. The maximum values of involved calculations can serve as measures of numerical range of the algorithm. The following intermediate calculations made in (Eq. 9), (Eq. 10), and (Eq. 18) are of interest.

$$|X_n^T X_n| \leq L|x_{max}|^2 \quad (22)$$

$$|x_n^T \text{sign}\{x_n\}| \leq L|x_{max}| \quad (23)$$

$$|X_n^T G_n x_n| \leq g_{max}|x_{max}|^2, \ 0 < g_{max} \leq 1, \quad (24)$$

$$|x_n^T G_n \text{sign}\{x_n\}| \leq g_{max} L|x_{max}|, \ 0 < g_{max} \leq 1 \quad (25)$$

$$\|G_n x_n\|_\infty \leq g_{max}|x_{max}|, \ 0 < g_{max} \leq 1 \quad (26)$$

$$\|G_n \text{sign}\{x_n\}\|_\infty \leq g_{max}, \ 0 < g_{max} \leq 1 \quad (27)$$

Equations 22–25 are computational results stored in the accumulator of the chip. Thus, they determine the required size of the accumulator. Equations 26 and 27 show the maximum dynamic range of calculations in the multiplier of the chip. Table 2 below summarizes the numerical dynamic range of calculations for the previously presented algorithms.

TABLE 2

Maximum values in intermediate calculations required for presented algorithms

| Algorithm | Multiplier | Accumulator |
|---|---|---|
| NLMS | $|Xmax|^2$ | $L|Xmax|^2$ |
| PNLMS | $|Xmax|^2$ | $L|Xmax|^2$ |
| SR-PNLMS | $|Xmax|$ | $L|X\ max|$ |
| SR-PNLMS (fast) | $|Xmax|$ | $L|X\ max|$ |

With regard to the maximum values required to be presented in the intermediate calculations of the algorithm, we find that the dynamic range of the calculations in the SR-PNLMS algorithm are roughly proportional to the square root of the corresponding ones in the PNLMS algorithm. This property of SR-PNLMS is desirable from a numerical point of view.

6. Simulations

The objective of this section is to compare the convergence performance of the SR-PNLMS with the NLMS and PNLMS algorithms. Four types of simulations are made where the first two show convergence with white noise and speech, respectively, as the excitation signal. The last two show the performance of the robust version of the SR-PNLMS in double-talk situations. One case uses a speech signal and the other use a composite source signal as input. The latter is the ITU-T test 3B, International Telecommunication Union, "ITU-T G.168," Report, 1997, Section 3.4. Table 3 shows detailed equations for SR-PNLMS and Table 4 displays the equations for the robust SR-PNLMS algorithm.

TABLE 3

The SR-PNLMS algorithm. *the divisions is removed by normalizing the regularization parameter

|  | Multi. | Div. |
|---|---|---|
| Step-size calculation | | |
| $\gamma_{l,n} = \max\{\rho \max\{\delta_p, |h_{0,n}|, \ldots, |h_{L-1,n}|\}, |h_{l,n}|\}, 0 \le l \le L-1$ | 1 | — |
| $g_{l,n} = L\gamma_{l,n} \bigg/ \sum_{i=0}^{L-1} \gamma_{i,n}, 0 \le l \le L-1$ | 1* | * |
| $G_n = diag\{g_{0,n}, \ldots, g_{L-1,n}\}$ | | — |
| Normalization update | | |
| $\tilde{\delta}_n = \tilde{\delta}_{n-1} + |x_n| - |x_{n-L}|, \tilde{\delta}_{-1} = \delta_r$ | | |
| Filtering | | |
| $e_n = y_n - h_{n-1}^T x_n$ | L | — |
| $h_n = h_{n-1} + \dfrac{\mu G_n sign\{x_n\} e_n}{x_n^T G_n sign\{x_n\} + \delta/\tilde{\delta}_n}$ | 2L + 1 | 2 |

TABLE 4

The robust SR-PNLMS algorithm. * the L divisions is removed by normalizing the regularization parameter

|  | Multi. | Div. |
|---|---|---|
| Step-size calculation | | |
| $\gamma_{l,n} = \max\{\rho \max\{\delta_p, |h_{0,n}|, \ldots, |h_{L-1,n}|\}, |h_{l,n}|\}, 0 \le l \le L-1$ | 1 | — |
| $g_{l,n} = L\gamma_{l,n} \bigg/ \sum_{i=0}^{L-1} \gamma_{i,n}, 0 \le l \le L-1$ | 1* | * |
| $G_n = diag\{g_{0,n}, \ldots, g_{L-1,n}\}$ | | — |
| Normalization update | | |
| $\tilde{\delta}_n = \tilde{\delta}_{n-1} + |x_n| - |x_{n-L}|, \tilde{\delta}_{-1} = \delta_r$ | | |
| Filtering | | |
| $e_n = y_n - h_{n-1}^T x_n$ | L | — |
| $h_n = h_{n-1} + \dfrac{\mu G_n sign\{x_n\} e_n}{x_n^T G_n sign\{x_n\} + \delta/\tilde{\delta}_n}$ | 2L + 1 | 2 |
| if (no double-talk detected) | | |
| $s_n = \lambda s_{n-1} + \dfrac{(1-\lambda)k_0}{\beta}\psi(|e_n|)$ | 2 | — |
| else | | |
| $s_n = \lambda s_{n-1} + (1-\lambda)s_{\min}$ | 2 | — |
| end | | |

Simulation conditions for the first two test cases are:

$\sigma_x = 1.9 \cdot 10^3$, SNR=39 dB (echo-to-noise ratio)

$\mu$=0.2, L=512 (64 ms), $\delta=1\cdot 10^6$, $\delta_p$=0.01, $\rho$=0.01, $\delta_r$=1

$h_{-1}=0$

Figure 2A:
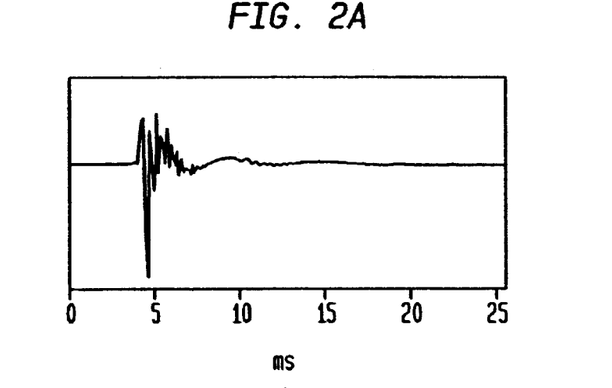
FIG. 2A is a graph illustrating the impulse response of the echo path in accordance with an embodiment of the present invention.
Figure 2B:
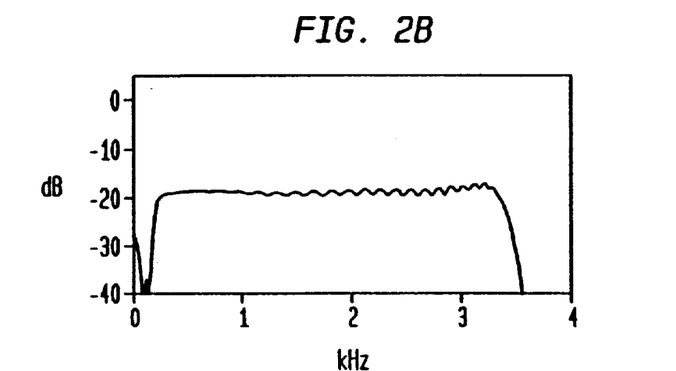
FIG. 2B is a graph illustrating the magnitude of the frequency response of the echo path in accordance with an embodiment of the present invention.

The impulse response and corresponding amplitude function is found in FIG. 2. The step-size parameter $\mu$ is chosen such that NLMS and PNLMS have approximately the same minimum mean square error when fully converged for the case with a white noise input signal.

Figure 3A:
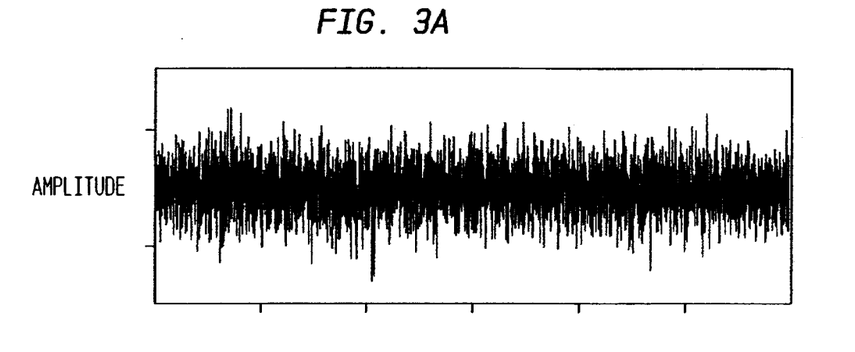
FIG. 3A is a graph illustrating performance in response to a white noise input after abrupt hybrid changes for a far-end signal for a particular embodiment of the present invention for a hybrid attenuation of 20 dB.
Figure 3B:
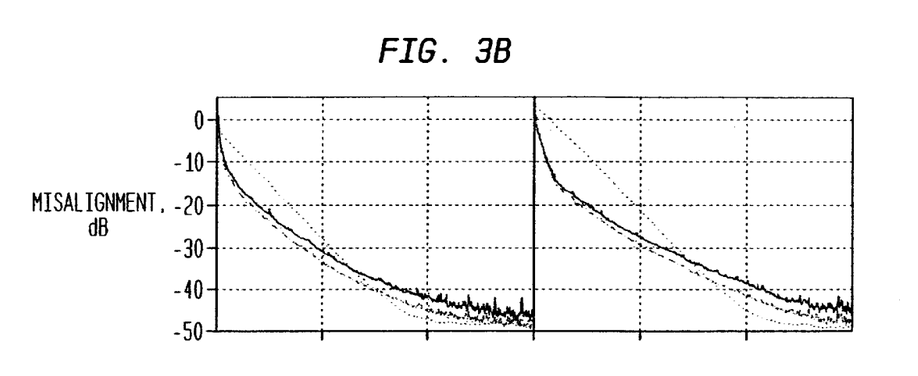
FIG. 3B is a graph illustrating performance in response to a white noise input after abrupt hybrid changes for a misalignment for (1) a particular embodiment of the present invention, (2) a PNLMS algorithm of the prior art, and (3) a NLMS algorithm of the prior art, respectively.
Figure 3C:
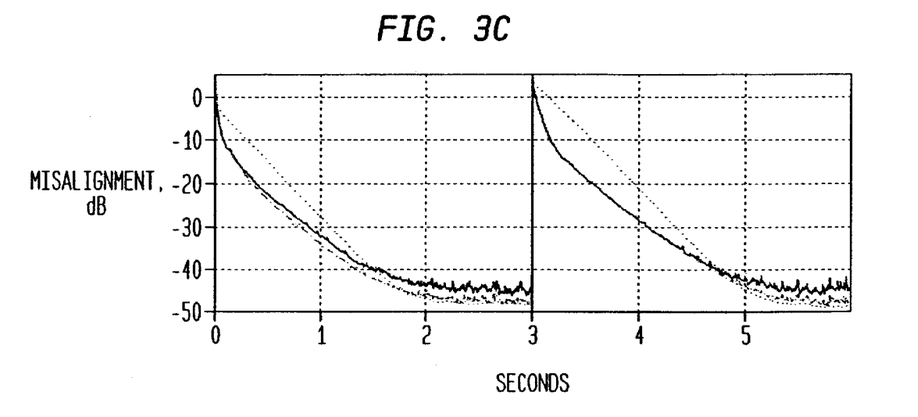
FIG. 3C is a graph illustrating performance in response to a white noise input after abrupt hybrid changes for a misalignment for corresponding ++ versions of the algorithms illustrated in FIG. 3B.

FIG. 3 shows initial convergence and re-convergence for the algorithms. At the time instant 3s, the echo path is abruptly changed by delaying it 200 samples (25 ms). PNLMS++ and SR-PNLMS++ have the same convergence rate which is much faster than that of NLMS. The penalty paid for using the sign of the regressor is a slightly poorer minimum misalignment upon convergence, approximately 1.5 dB. Similar performance is seen for the signed regressor PNLMS in comparison with the PNLMS algorithm. On the other hand, they have a slightly higher convergence rate from 0 to approximately 20 dB.

Figure 4A:
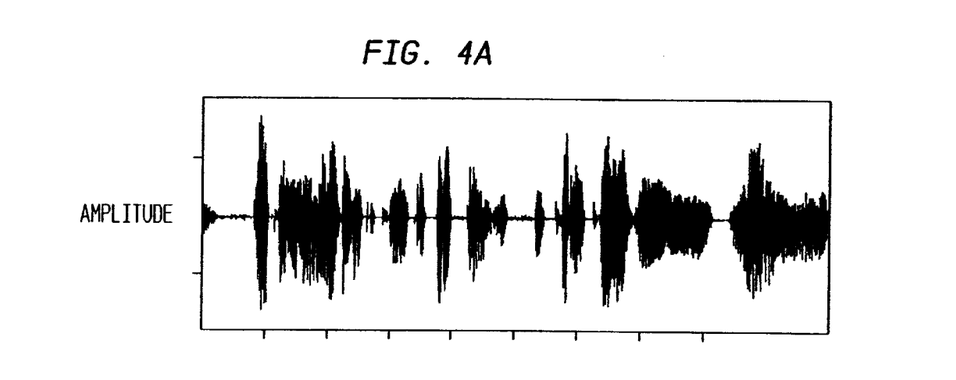
FIG. 4A is a graph illustrating performance in response to a speech signal input after abrupt hybrid changes for a far-end signal with a hybrid attenuation of 20 dB in accordance with a particular embodiment of the present invention.
Figure 4B:
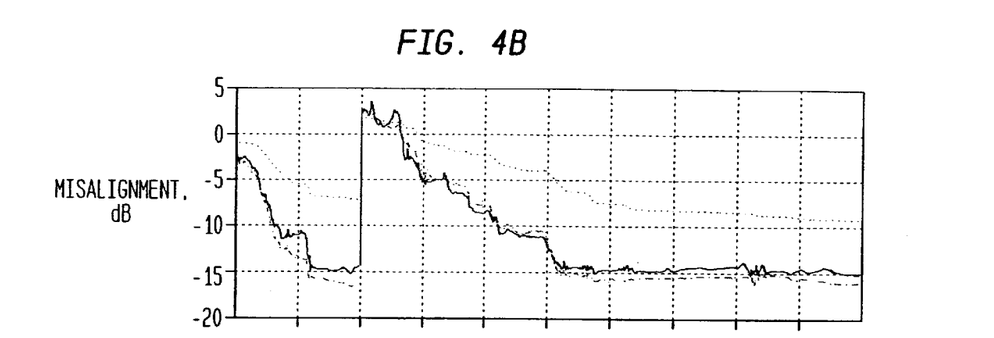
FIG. 4B is a graph illustrating performance in response to a speech signal input after abrupt hybrid changes for a misalignment for (1) a particular embodiment of the present invention, (2) a PNIMS algorithm of the prior art, and (3) a NLMS algorithm of the prior art, respectively.
Figure 4C:
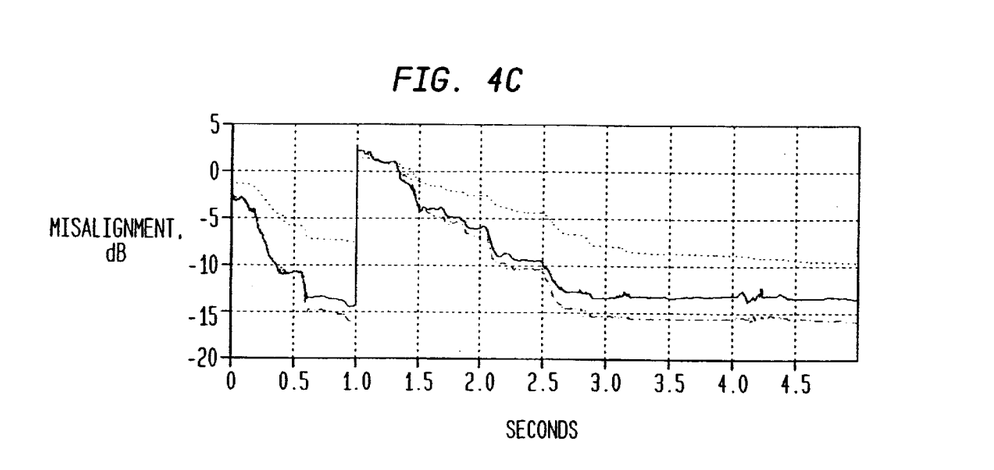
FIG. 4C is a graph illustrating performance in response to a speech signal input after abrupt hybrid changes for a misalignment for corresponding ++ versions of the same algorithms illustrated in FIG. 4B.

Results from a similar simulation using speech as input is seen in FIG. 4. The same performance gain of SR-PNIMS (++) and PNIMS(++) over NLMS is experienced. In this figure, the somewhat slower convergence rate of the "++" algorithms is more clearly seen.

The third simulation shows the performance of the robust SR-PNLMS algorithm after an abrupt hybrid change as in the examples above, and also during double-talk. This shows the gains and losses of the scaled non-linearity in (Eq. 19). In this simulation, all three algorithms, NIMS, PNLMS and robust SR-PNLMS, are controlled by a Geigel double-talk detector (DTD), D. L. Duttweiler, "A twelve-channel digital echo canceler," IEEE Trans. Commun., vol. 26, no. 5, pp. 647–653, May 1978, that does its best to inhibit adaptation when double-talk starts. Settings for the DTD and the robust algorithm are:

The DTD assumes 6 dB hybrid attenuation (standard value), i.e., its threshold is set to 0.5.

$k_0$ 1.1, $\lambda$=0.997.

Hybrid attenuation: 20 dB.

Figure 5A:
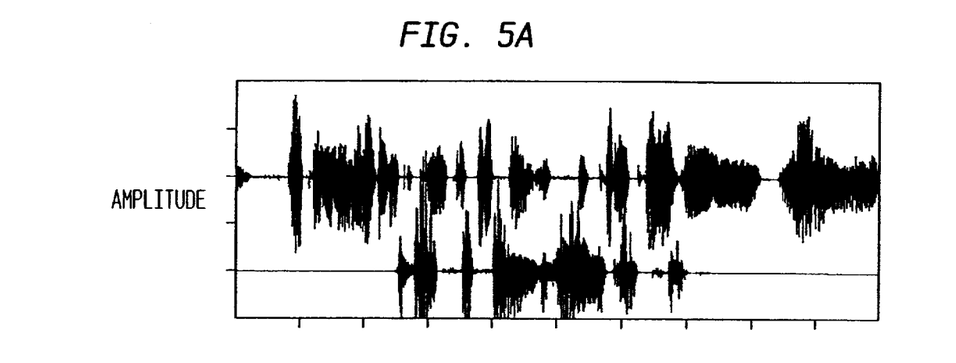
FIG. 5A is a graph illustrating performance in response to a speech signal input after abrupt hybrid changes for a far-end signal with a hybrid attenuation of 20 dB in accordance with a particular embodiment of the present invention.
Figure 5B:
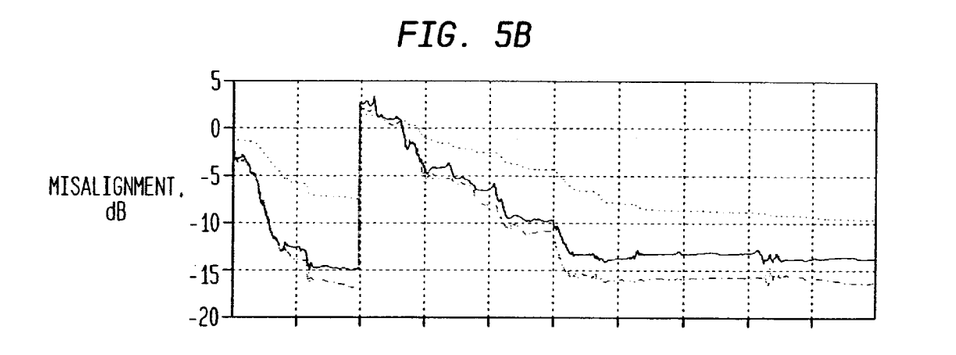
FIG. 5B is a graph illustrating performance in response to a speech signal input after abrupt hybrid changes and during double-talk for a misalignment for (1) a particular embodiment of the present invention, (2) a PNLMS algorithm of the prior art, and (3) NLMS algorithm of the prior art, respectively.
Figure 5C:
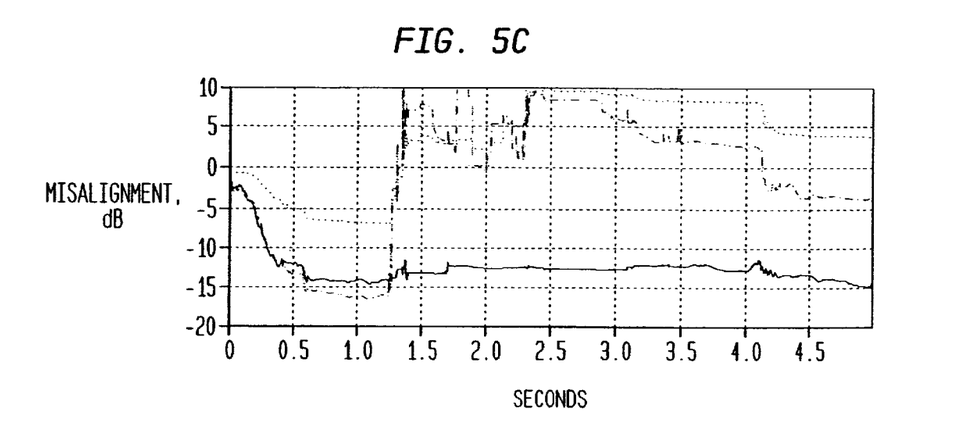
FIG. 5C is a graph illustrating performance in response to a speech signal input after abrupt hybrid changes and during double-talk for a misalignment for corresponding ++ versions of the same algorithms shown in FIG. 5B.

In FIG. 5a the far- and near-end speech signals are shown. The average far-to near-end ratio is 0 dB. FIG. 5b shows the re-convergence of the algorithms after the echo path change occurring at 1 s (near-end speech is not present in this simulation). The convergence rate of the robust SR-PNLMS is only slightly slower than PNIMS but still much faster than NLMS. For the double-talk case in FIG. 5C, we find that the robust SR-PNLMS performs far better than the non-robust algorithms when exposed to double-talk.

The fourth simulation is the test 3B described in, International Telecommunication Union, "ITU-T g.168," Report, 1997, Section 3.4. In this test, a synthetic signal called composite source signal, is used as the excitation input to the echo path. This also is a double-talk test where we compare the (non-robust) NLMS and PNLMS++ algorithms with the robust version of SR-PNLMS (Eq. 19) (all three incorporating a Geigel DTD). Conditions for the algorithms are:

The DTD assumes 3 dB hybrid attenuation i.e. its threshold is set to 0.71.

$k_0$=1.5, $\lambda$=0.9975.

Hybrid attenuation: 6 dB (short sparse hybrid).

Figure 6A:
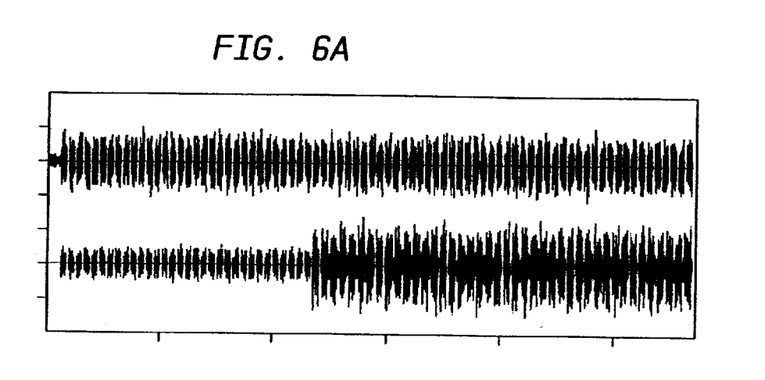
FIG. 6A is a graph illustrating performance in response to a composite source signal during double talk for far-end and near-end signals in accordance with a particular embodiment of the present invention.
Figure 6B:
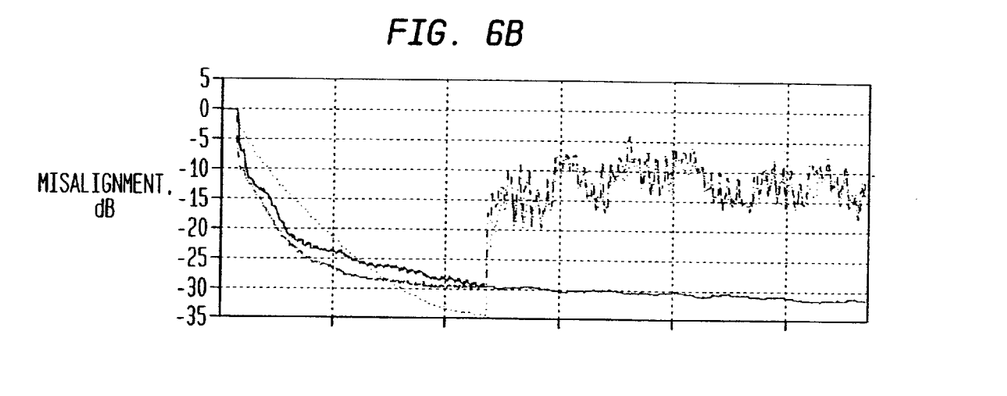
FIG. 6B is a graph illustrating misalignment during double-talk in response to a composite source signal for (1) a particular embodiment of the present invention, (2) a PNLMS algorithm of the prior art, and (3) a NLMS algorithm of the prior art, respectively.
Figure 6C:
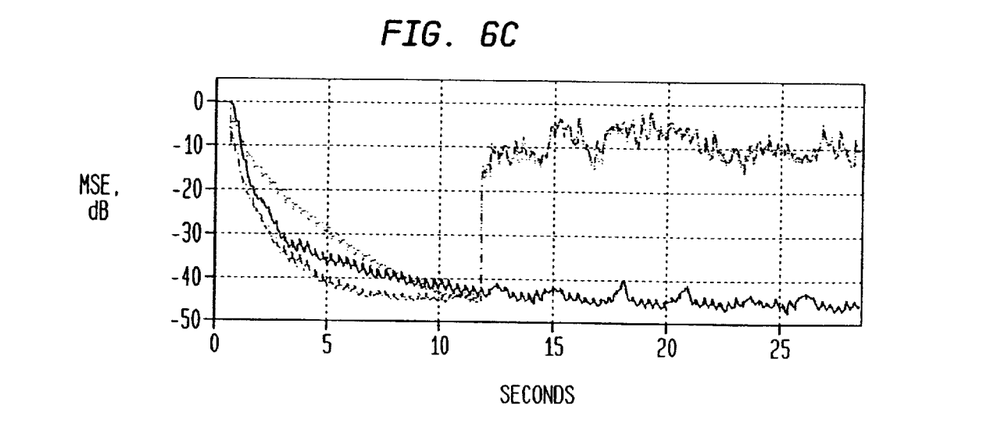
FIG. 6C is a graph illustrating mean square error during double-talk in response to a composite source signal for the corresponding ++ versions of the same algorithms shown in FIG. 6B.

The 3 dB assumption in the DTD is chosen since the hybrid only has 6 dB attenuation, which is a very difficult case for the DTD. FIG. 6 shows the signals, misalignment and mean square error, MSE. The mean square error which is used as the performance index in International Telecommunication Union, "ITU-T G.168," Report, 1997, Section 3.4, is calculated as, $$MSE = \frac{P_{e-w}}{P_{y-w}} \quad (28)$$

$$P_{e-w} = LPF\{(e_n - w_n)^2\} \quad (29)$$

where the LPF denotes a lowpass filter. In this case, it has a single pole at 0.999. The convergence rate shows the same behavior with this signal as for speech. For the robust SR-PNLMS, neither the misalignment nor the mean square error is significantly changed during double-talk.

7. Conclusions

We have described a new algorithm, SR-PNLMS, that simplifies the gradient calculations of the PNIMS algorithm by replacing the regressor or vector with its sign. With proper normalization and regularization, this new algorithm has approximately the same convergence performance as the original PNLMS algorithm, however, it has lower complexity and smaller numerical range in its calculations. The latter is advantageous in a fixed-point implementation of the algorithm since higher precision can be maintained with a finite numerical range or alternatively, fewer bits can be used without degrading performance.

The SR-PNLMS can be made robust against double-talk in the same way as has been previously shown for NLMS and PNLMS. The robust SR-PNLMS algorithm has been proven competitive to PNLMS and out-performs NLMS.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

We claim:

1. A method of generating an estimate signal that is an estimate of an impulse response of a communications system to an original signal, said method comprising the steps of:

(1) receiving said original signal; and (2) generating an estimate of an impulse response to said original signal by means of a signed regressor-proportionate normalized least mean squares algorithm;

wherein step (2) comprises generating an estimate of an impulse response to said original signal by means of a proportionate normalized least mean squares algorithm in which is used a proportionate step-size matrix and only the sign of a regressor value, rather than the regressor value itself.

2. The method of claim 1 wherein step (2) comprises solving the equation:

$$h_n = h_{n-1} + \frac{\mu}{x_n^T G_n sign\{x_n\} + \delta/(x_n^T sign\{x_n\} + \delta_r)} G_n sign\{x_n\} e_n.$$

3. The method of claim 1 wherein step (2) comprises alternating between solving the following equations:

$$h_n = h_{n-1} + \frac{\mu}{x_n^T G_n sign\{x_n\} + \delta/(x_n^T sign\{x_n\} + \delta_r)} G_n sign\{x_n\} e_n \text{ and}$$

$$h_n = h_{n-1} + \frac{\mu}{x_n^T sign\{x_n\} + \delta/(x_n^T sign\{x_n\} + \delta_r)} sign\{x_n\} e_n.$$

4. The method of claim 1 wherein step (2) comprises solving the equation:

$$h_n = h_{n-1} + \frac{\mu}{2\rho g_{max,n} x_n^T sign\{x_n\} + \delta/(x_n^T sign\{x_n\} + \delta_r)} G_n sign\{x_n\} e_n.$$

5. The method of claim 1 wherein step (2) comprises alternating between solving the following equations:

$$h_n = h_{n-1} + \frac{\mu}{2\rho g_{max,n} x_n^T sign\{x_n\} + \delta/(x_n^T sign\{x_n\} + \delta_r)} G_n sign\{x_n\} e_n \text{ and}$$

$$h_n = h_{n-1} + \frac{\mu}{x_n^T sign\{x_n\} + \delta/(x_n^T sign\{x_n\} + \delta_r)} sign\{x_n\} e_n.$$

6. The method of claim 1 wherein step (2) comprises solving the equation:

$$h_n = h_{n-1} + \frac{\mu}{x_n^T sign\{x_n\} + \delta/(x_n^T sign\{x_n\} + \delta_r)} G_n sign\{x_n\} e_n \psi\left(\frac{|e_n|}{s_{n-1}}\right) sign\{e_n\} s_{n-1}.$$

7. The method of claim 6 wherein:

$$\psi\left(\frac{|e_n|}{s}\right) = \min\left\{k_0, \frac{|e_n|}{s}\right\}.$$

8. The method of claim 6 wherein:

$$s_n = \lambda s_{n-1} + \frac{1-\lambda}{\beta} s_{n-1} \psi\left(\frac{|e_n|}{s_{n-1}}\right).$$

9. A method of generating a signal that is an estimate of an echo of an original signal received at a transceiver via a communications system, said original signal being coupled into a signal that is transmitted from said transceiver via said communications system, said method comprising the steps of:

(1) receiving said original signal; and (2) generating an estimate of an impulse response to said original signal by means of a signed regressor-proportionate normalized least mean squares algorithm;

wherein step (2) comprises generating an estimate of an impulse response to said original signal by means of a proportionate normalized least mean squares algorithm in which is used a proportionate step-size matrix and only the sign of a regressor value, rather than the regressor value itself.

10. The method of claim 9 wherein step (2) comprises solving the equation:

$$h_n = h_{n-1} + \frac{\mu}{x_n^T G_n sign\{x_n\} + \delta/(x_n^T sign\{x_n\} + \delta_r)} G_n sign\{x_n\} e_n.$$

11. The method of claim 9 wherein step (2) comprises alternating between solving the following equations:

$$h_n = h_{n-1} + \frac{\mu}{x_n^T G_n sign\{x_n\} + \delta/(x_n^T sign\{x_n\} + \delta_r)} G_n sign\{x_n\} e_n \text{ and}$$

$$h_n = h_{n-1} + \frac{\mu}{x_n^T sign\{x_n\} + \delta/(x_n^T sign\{x_n\} + \delta_r)} sign\{x_n\} e_n.$$

12. The method of claim 9 wherein step (2) comprises solving the equation:

$$h_n = h_{n-1} + \frac{\mu}{2\rho g_{max,n} x_n^T sign\{x_n\} + \delta/(x_n^T sign\{x_n\} + \delta_r)} G_n sign\{x_n\} e_n.$$

13. The method of claim 9 wherein step (2) comprises alternating between solving the following equations:

$$h_n = h_{n-1} + \frac{\mu}{2\rho g_{max,n} x_n^T sign\{x_n\} + \delta/(x_n^T sign\{x_n\} + \delta_r)} G_n sign\{x_n\} e_n \text{ and}$$

$$h_n = h_{n-1} + \frac{\mu}{x_n^T sign\{x_n\} + \delta/(x_n^T sign\{x_n\} + \delta_r)} sign\{x_n\} e_n.$$

14. The method of claim 9 wherein step (2) comprises solving the equation:

$$h_n = h_{n-1} + \frac{\mu}{x_n^T sign\{x_n\} + \delta/(x_n^T sign\{x_n\} + \delta_r)} G_n sign\{x_n\} \psi\left(\frac{|e_n|}{s_{n-1}}\right) sign\{e_n\} s_{n-1}.$$

15. The method of claim 14 wherein:

$$\psi\left(\frac{|e_n|}{s}\right) = \min\left\{k_0, \frac{|e_n|}{s}\right\}.$$

16. The method of claim 14 wherein:

$$s_n = \lambda s_{n-1} + \frac{1-\lambda}{\beta} s_{n-1} \psi\left(\frac{|e_n|}{s_{n-1}}\right).$$

17. A method of performing echo cancellation in a communications system, said method comprising the steps of:

(1) receiving a signal that is a potential source of echo;

(2) generating an estimate of an impulse response corresponding to echo of said original signal by means of a signed regressor-proportionate normalized least mean squares algorithm; and (3) subtracting said estimate signal from a transmitted signal in order to cancel said echo from said transmitted signal;

wherein step (2) comprises generating an estimate of an impulse response to said original signal by means of a proportionate normalized least mean squares algorithm in which is used a proportionate step-size matrix and only the sign of a regressor value, rather than the regressor value itself.

18. The method of claim 17 wherein step (2) comprises solving the equation:

$$h_n = h_{n-1} + \frac{\mu}{x_n^T G_n sign\{x_n\} + \delta/(x_n^T sign\{x_n\} + \delta_r)} G_n sign\{x_n\} e_n.$$

19. The method of claim 17 wherein step (2) comprises alternating between solving the following equations:

$$h_n = h_{n-1} + \frac{\mu}{x_n^T G_n sign\{x_n\} + \delta/(x_n^T sign\{x_n\} + \delta_r)} G_n sign\{x_n\} e_n \text{ and}$$

$$h_n = h_{n-1} + \frac{\mu}{x_n^T sign\{x_n\} + \delta/(x_n^T sign\{x_n\} + \delta_r)} sign\{x_n\} e_n.$$

20. The method of claim 17 wherein step (2) comprises solving the equation:

$$h_n = h_{n-1} + \frac{\mu}{2\rho g_{\max,n} x_n^T sign\{x_n\} + \delta/(x_n^T sign\{x_n\} + \delta_r)} G_n sign\{x_n\} e_n.$$

21. The method of claim 17 wherein step (2) comprises alternating between solving the following equations:

$$h_n = h_{n-1} + \frac{\mu}{2\rho g_{\max,n} x_n^T sign\{x_n\} + \delta/(x_n^T sign\{x_n\} + \delta_r)} G_n sign\{x_n\} e_n \text{ and}$$

$$h_n = h_{n-1} + \frac{\mu}{x_n^T sign\{x_n\} + \delta/(x_n^T sign\{x_n\} + \delta_r)} sign\{x_n\} e_n.$$

22. The method of claim 17 wherein step (2) comprises solving the equation:

$$h_n = h_{n-1} + \frac{\mu}{x_n^T sign\{x_n\} + \delta/(x_n^T sign\{x_n\} + \delta_r)} G_n sign\{x_n\} \psi\left(\frac{|e_n|}{s_{n-1}}\right) sign\{e_n\} s_{n-1}.$$

23. The method of claim 22 wherein:

$$\psi\left(\frac{|e_n|}{s}\right) = \min\left\{k_0, \frac{|e_n|}{s}\right\}.$$

24. The method of claim 22 wherein:

$$s_n = \lambda s_{n-1} + \frac{1-\lambda}{\beta} s_{n-1} \psi\left(\frac{|e_n|}{s_{n-1}}\right).$$

25. An apparatus for performing echo cancellation in a transceiver, said apparatus comprising:

(1) a transmit electrical path upon which transmit signals are imposed by said transceiver;

(2) a receive electrical path upon which are received signals that are a potential source of echo that may be coupled onto said transmit path are received at said transceiver;

(3) a circuit for generating a signal that is an estimate of an impulse response corresponding to echo of said received signals that may be coupled onto said transmit path, said circuit generating said estimate signal by means of a signed regressor-proportionate normalized least mean squares algorithm; and (4) a subtracter coupled to receive said estimate signal at a first input thereto and coupled to receive said transmitted signal at a second input thereto and generate at an output thereof a signal that is the difference between said first and second inputs in order to cancel said echo from said transmitted signal;

wherein step (2) comprises generating an estimate of an impulse response to said original signal by means of a proportionate normalized least mean squares algorithm in which is used a proportionate step-size matrix and only the sign of a regressor value, rather than the regressor value itself.

26. The method of claim 25 wherein step (2) comprises solving the equation:

$$h_n = h_{n-1} + \frac{\mu}{x_n^T G_n sign\{x_n\} + \delta/(x_n^T sign\{x_n\} + \delta_r)} G_n sign\{x_n\} e_n.$$

27. The method of claim 25 wherein step (2) comprises alternating between solving the following equations:

$$h_n = h_{n-1} + \frac{\mu}{x_n^T G_n sign\{x_n\} + \delta/x_n^T sign\{x_n\} + \delta_r)} G_n sign\{x_n\} e_n \text{ and}$$

$$h_n = h_{n-1} + \frac{\mu}{x_n^T sign\{x_n\} + \delta/(x_n^T sign\{x_n\} + \delta_r)} sign\{x_n\} e_n.$$

28. The method of claim 25 wherein step (2) comprises solving the equation:

$$h_n = h_{n-1} + \frac{\mu}{2\rho g_{\max,n} x_n^T sign\{x_n\} + \delta/(x_n^T sign\{x_n\} + \delta_r)} G_n sign\{x_n\} e_n.$$

29. The method of claim 25 wherein step (2) comprises alternating between solving the following equations:

$$h_n = h_{n-1} + \frac{\mu}{2\rho g_{\max,n} x_n^T sign\{x_n\} + \delta/(x_n^T sign\{x_n\} + \delta_r)} G_n sign\{x_n\} e_n \text{ and}$$

$$h_n = h_{n-1} + \frac{\mu}{x_n^T sign\{x_n\} + \delta/(x_n^T sign\{x_n\} + \delta_r)} sign\{x_n\} e_n.$$

30. The method of claim 25 wherein step (2) comprises solving the equation:

$$h_n = h_{n-1} + \frac{\mu}{x_n^T sign\{x_n\} + \delta/(x_n^T sign\{x_n\} + \delta_r)} G_n sign\{x_n\} \psi\left(\frac{|e_n|}{s_{n-1}}\right) sign\{e_n\} s_{n-1}.$$

31. The method of claim 30 wherein:

$$\psi\left(\frac{|e_n|}{s}\right) = \min\left\{k_0, \frac{|e_n|}{s}\right\}.$$

32. The method of claim 30 wherein:

$$s_n = \lambda s_{n-1} + \frac{1-\lambda}{\beta} s_{n-1} \psi\left(\frac{|e_n|}{s_{n-1}}\right).$$

* * * * *